United States Patent
Boerstler et al.

(10) Patent No.: US 7,363,178 B2
(45) Date of Patent: Apr. 22, 2008

(54) METHOD AND APPARATUS FOR MEASURING THE RELATIVE DUTY CYCLE OF A CLOCK SIGNAL

(75) Inventors: David William Boerstler, Round Rock, TX (US); Eskinder Hailu, Austin, TX (US); Jieming Qi, Austin, TX (US); Bin Wan, Pittsburgh, PA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/555,018

(22) Filed: Oct. 31, 2006

(65) Prior Publication Data

US 2007/0271068 A1 Nov. 22, 2007

Related U.S. Application Data

(63) Continuation-in-part of application No. 11/383,570, filed on May 16, 2006, now Pat. No. 7,333,905, which is a continuation-in-part of application No. 11/380,982, filed on May 1, 2006.

(51) Int. Cl.
G01R 29/02 (2006.01)
(52) U.S. Cl. ...................................... 702/79
(58) Field of Classification Search .................. 702/75, 702/79, 176; 327/175, 291, 292
See application file for complete search history.

(56) References Cited

U.S. PATENT DOCUMENTS

| 4,552,118 A | 11/1985 | Fukaya |
|---|---|---|
| 4,675,597 A | 6/1987 | Hernandez |
| 4,814,872 A | 3/1989 | Ivie |
| 4,859,944 A | 8/1989 | Webb |
| 5,367,200 A | 11/1994 | Leonida |
| 6,084,452 A | 7/2000 | Drost et al. |
| 6,150,847 A | 11/2000 | Lu |
| 6,664,834 B2 | 12/2003 | Nair et al. |
| 6,700,530 B1 | 3/2004 | Nilsson |
| 6,798,266 B1* | 9/2004 | Vu et al. .................. 327/291 |
| 6,847,244 B2 | 1/2005 | Pillay et al. |
| 7,002,358 B2 | 2/2006 | Wyatt |

(Continued)

FOREIGN PATENT DOCUMENTS

EP 0957605 A2 11/1999

OTHER PUBLICATIONS

Maxim—"Charge Pumps Shine in Portable Designs"; Maxim Application Note 669 (Mar. 15, 2001).

(Continued)

*Primary Examiner*—Michael Nghiem
(74) *Attorney, Agent, or Firm*—D'Ann Rifai; Mark P. Kahler

(57) ABSTRACT

In one embodiment, the disclosed methodology and apparatus measure relative duty cycle information of a clock signal with respect to an input node as the clock signal travels to selected nodes of a clock distribution network on an electronic circuit. The apparatus operates in a benchmark mode to determine benchmark duty cycle information and then subsequently operates an a relative mode to determine relative duty cycle information of the clock signal at a selected node in comparison to the clock signal at an external input node.

9 Claims, 10 Drawing Sheets

U.S. PATENT DOCUMENTS

| | | | |
|---|---|---|---|
| 2002/0097035 | A1 | 7/2002 | Atallah et al. |
| 2005/0225314 | A1 | 10/2005 | Belleau |
| 2006/0181320 | A1* | 8/2006 | Dreps et al. ............... 327/175 |
| 2007/0071155 | A1* | 3/2007 | Boerstler et al. ........... 375/376 |
| 2007/0252629 | A1* | 11/2007 | Boerstler et al. ........... 327/175 |
| 2007/0255517 | A1* | 11/2007 | Boerstler et al .............. 702/79 |
| 2007/0266285 | A1* | 11/2007 | Boerstler et al. ........... 714/731 |

OTHER PUBLICATIONS

Tsang, et al.—"Picosecond Imaging Analysis (PICA)"—IBM JRD, vol. 44, No. 4 (Jul. 2000).

Bhatti, et al.—"Duty Cycle Measurement & Correction Using a Random Sampling Technique", Proceedings of the 48th IEEE Int'l. Midwest Symposium on Circuits & Systems, (Aug. 2005).

IBM—Cell Broadband Engine Architecture, Ver. 1.0 (Aug. 2005).

Mantano—"A 1-Gb/s/pin 512-Mb DDRII SDRAM Using a Digital DLL and a Slew-Rate-Controlled Output Buffer"—downloaded from www.elpida.com on Mar. 13, 2006.

NAM—"An All-Digital CMOS Duty Cycle Correction Circuit with a Duty-Cycle Correction Range of 15-to-85% for Multi-Phase Applications"; IEICE Trans. Electron., vol. E88-C, No. 4 (Apr. 2005).

Page—"IBMs CELL Processor: Preview to Greatness?" (May 15, 2005).

Travis, et al.—"Circuit Conditions Variable-Duty-Cycle Clock"; EDN Access (Feb. 17, 1997).

Boerstler, et al.—U.S. Appl. No. 11/380,982, filed May 1, 2006, for a "Method and Apparatus for On-Chip Duty Cycle Measurement".

Boerstler, et al.—U.S. Appl. No. 11/381,031, filed May 1, 2006, for a "Duty Cycle Measurement Method And Apparatus That Operates In A Calibration Mode And A Test Mode".

Boerstler, et al.—U.S. Appl. No. 11/381,050, filed May 1, 2006, for a "Method and Apparatus For Correcting The Duty Cycle Of A Digital Signal".

Boerstler, et al.—U.S. Appl. No. 11/383,570, filed May 16, 2006, for a "Method and Apparatus For Measuring The Duty Cycle Of A Digital Signal".

* cited by examiner

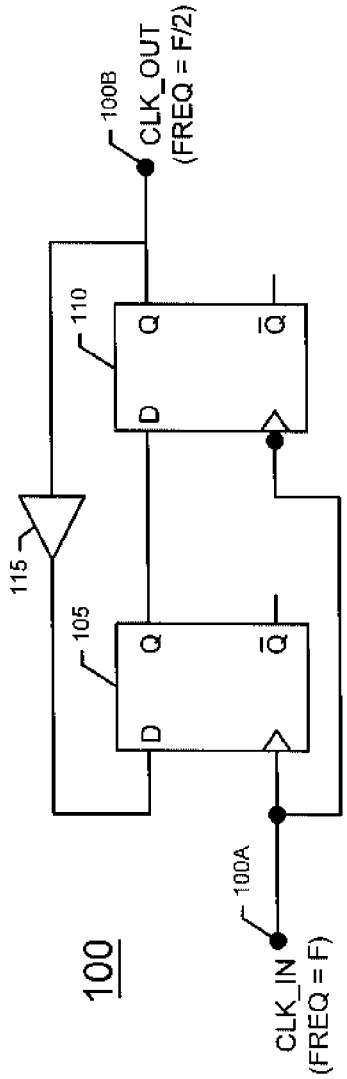
FIG. 1
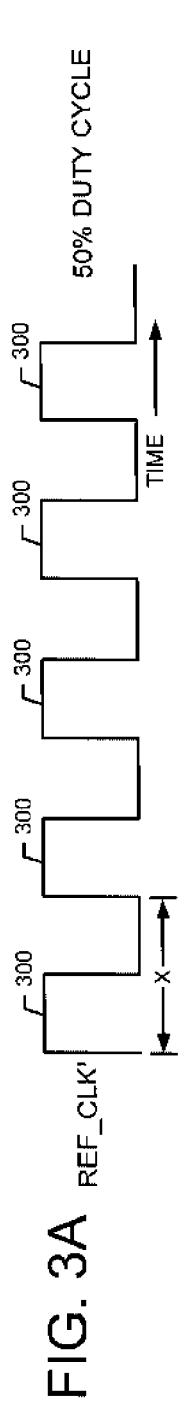
FIG. 3A REF_CLK'
FIG. 3B CLK_IN
FIG. 3C CLK_IN
FIG. 3D CLK_IN
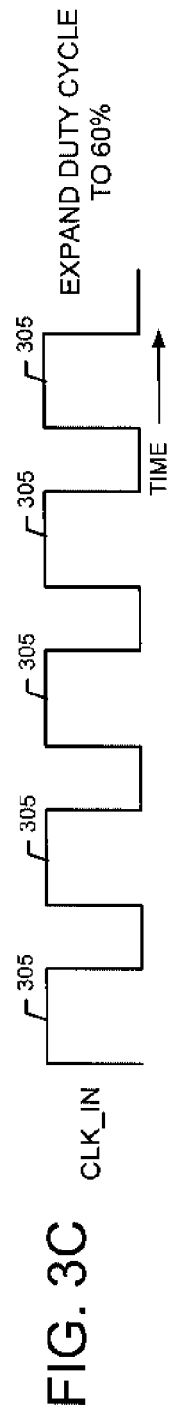

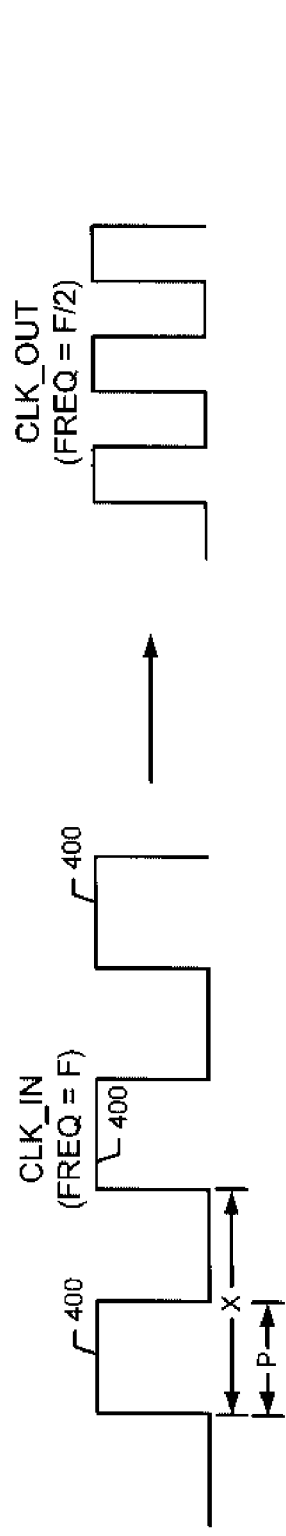
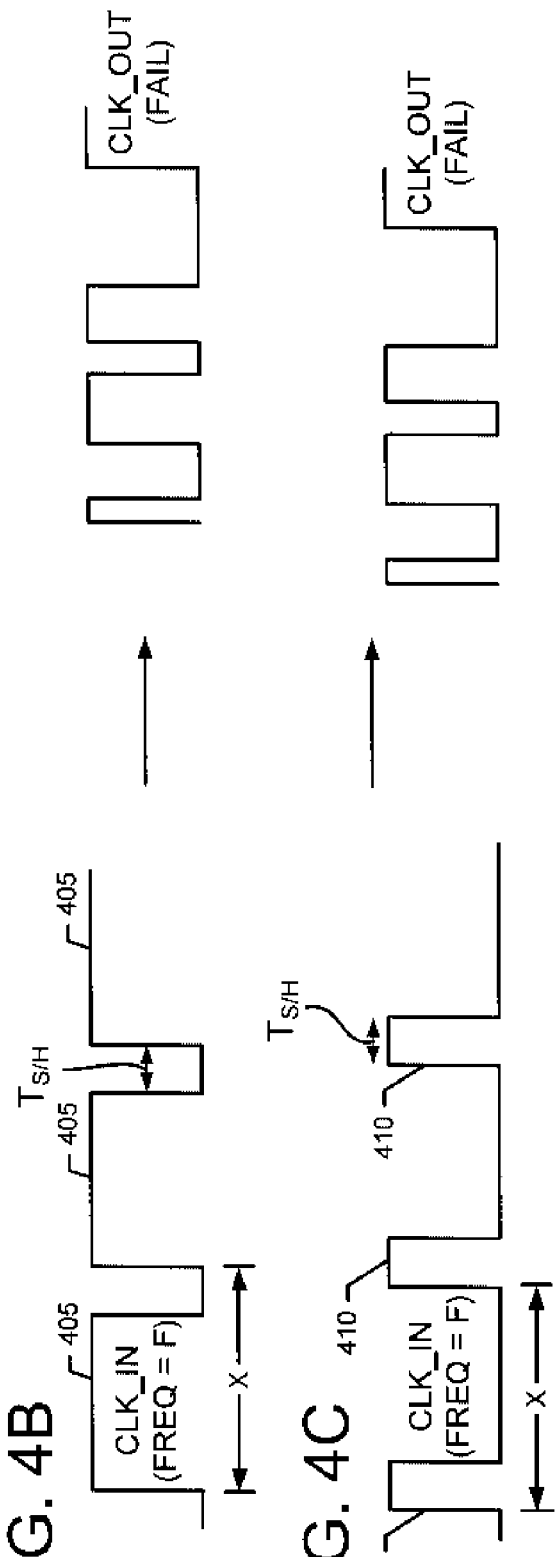
FIG. 4A
FIG. 4B
FIG. 4C

METHOD AND APPARATUS FOR MEASURING THE RELATIVE DUTY CYCLE OF A CLOCK SIGNAL

CROSS REFERENCE TO RELATED PATENT APPLICATIONS

This patent application is a continuation-in-part of, and claims priority to, the U.S. Patent Application entitled "Method and Apparatus For Measuring The Duty Cycle Of A Digital Signal", inventors Boerstler, et al., Ser. No. 11/383,570, filed May 16, 2006, that is assigned to the same Assignee as the subject patent application, the disclosure of which is incorporated herein by reference in its entirety. U.S. patent application Ser. No. 11/383,570 is a continuation-in-part of U.S. Patent Application entitled "Method and Apparatus For On-Chip Cycle Measurement", Ser. No. 11/380,982, filed May 1, 2006.

TECHNICAL FIELD OF THE INVENTION

The disclosures herein relate generally to digital systems, and more particularly, to a method and apparatus that measure the duty cycle of a variable duty cycle digital signal.

BACKGROUND

Some conventional clock signal generator circuits allow the user or designer to vary the duty cycle of a clock signal that the circuit produces. During a clock period, a clock signal exhibits a logic high for a portion of the period and a logic low for the remainder of the period. Duty cycle refers to the percentage of a clock period that the clock signal exhibits a particular logic state (e.g. a logic high). A signal that exhibits a logic high state for 50% of the signal period corresponds to a 50% duty cycle. Similarly, a signal that exhibits a logic high state for 40% of a signal period corresponds to a 40% duty cycle. Of course, the designer or user may alternatively employ inverted logic and define the duty cycle in terms of the percentage of a signal period that the signal exhibits a logic low state.

At relatively low frequencies up to and including the MHz range, it is not difficult to measure incremental changes or adjustments to the duty cycle of a digital signal. However, when dealing with clock circuits in the GHz range, the designer experiences significantly more difficulty in measuring small changes in the duty cycle of a digital signal. In terms of time instead of frequency, incremental adjustments to the clock duty cycle or pulse duration in the picosecond range are very difficult to measure.

One solution for measuring changes to the duty cycle of a clock signal in the picosecond range is a high speed oscilloscope with very large bandwidth. Unfortunately, a laboratory set up with a multi-GHz scope is expensive to implement and maintain. Moreover, care must be taken to assure that whatever circuitry couples the clock signal from a logic chip to the scope does not introduce jitter exceeding the duration of the incremental adjustment to the duty cycle.

Another approach to measuring changes to the duty cycle of a clock signal on an integrated circuit (IC) is picosecond imaging circuit analysis (PICA). The PICA method detects photons of light emitted on the leading and trailing edges of clock pulses to determine their duty cycle. While this type of duty cycle analysis does work, it is extremely expensive. Moreover, this type of analysis destroys the component under test.

What is needed is a duty cycle measurement method and apparatus that address the problems discussed above.

SUMMARY

Accordingly, in one embodiment, a method is disclosed for determining relative duty cycle information for a clock signal as it propagates through an electronic circuit such as a clock distribution network. The method includes sending, by a clock signal generator, a clock signal to the electronic circuit, the electronic circuit including a clock distribution network that distributes the clock signal to a plurality of locations across the clock distribution network. The method also includes operating, by a relative duty cycle measurement circuit, in a benchmark mode to determine benchmark duty cycle information with respect to the clock signal at a location external to the clock distribution network, thus designating an external clock signal. The method further includes operating, by the relative duty cycle measurement circuit, in a relative mode to determine relative duty cycle information of the clock signal at one of the plurality of locations in the clock distribution network relative to the benchmark duty cycle information, thus designating an internal clock signal.

In another embodiment, a test system is disclosed that includes an electronic circuit with a clock grid that distributes a clock signal to a plurality of distribution nodes in the clock grid. The test system includes a clock signal generator, coupled to the electronic circuit, that generates the clock signal for distribution by the clock grid. The test system also includes a relative duty cycle measurement circuit that couples to the clock signal generator and the plurality of distribution nodes of the clock grid. The relative duty cycle measurement circuit operates in a benchmark mode to determine benchmark duty cycle information with respect to the clock signal at a location in the test system external to the clock grid, thus designating an external clock signal. The relative duty cycle measurement circuit also operates in a relative mode to determine relative duty cycle information of the clock signal at one of the plurality of distribution nodes in the clock grid relative to the benchmark duty cycle information, thus designating an internal clock signal.

BRIEF DESCRIPTION OF THE DRAWINGS

The appended drawings illustrate only exemplary embodiments of the invention and therefore do not limit its scope because the inventive concepts lend themselves to other equally effective embodiments.

FIG. 1 shows one divider circuit that the disclosed duty cycle measurement (DCM) apparatus may employ.

FIGS. 3A-3D show clock signals exhibiting respective duty cycles as modified by a variable duty cycle circuit in the disclosed apparatus.

FIGS. 4A-4C show divider input and divider output signal under different operating conditions.

DETAILED DESCRIPTION

Figure 2:
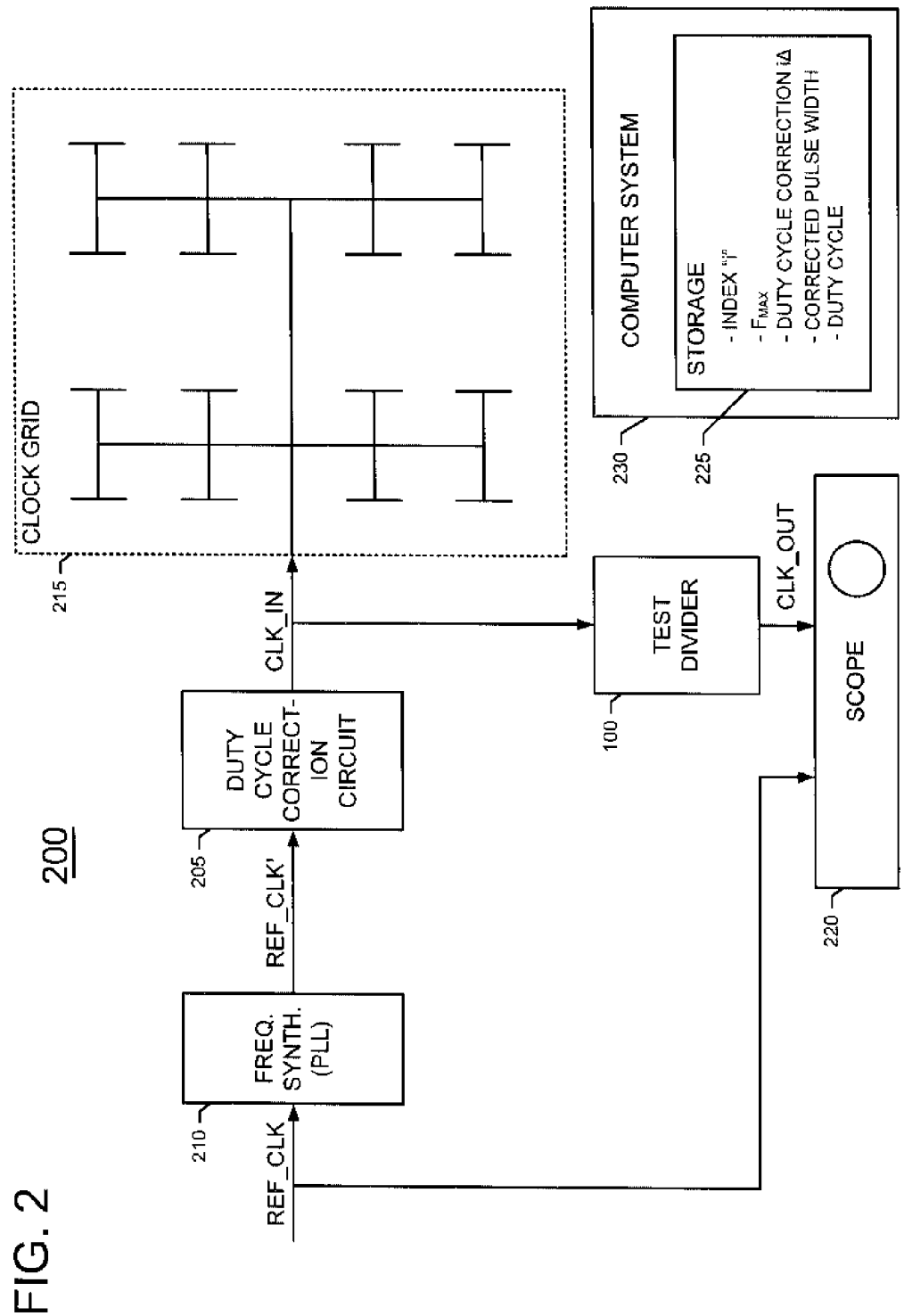
FIG. 2 shows one embodiment of the disclosed duty cycle measurement (DCM) apparatus.

In one embodiment, the disclosed apparatus and methodology provide a way to determine the duration of relatively small incremental changes in the duty cycle of a digital signal. While the disclosed apparatus is especially useful for measurements in the Gigahertz range, i.e. approximately 1 GHz and above, it may also measure incremental changes to the duty cycle of lower frequency digital signals.

In one embodiment, the disclosed methodology employs characteristics of a failed divider circuit, at the frequency where the divider circuit fails, to determine the duration of an incremental change or correction to the duty cycle of a clock signal. FIG. 1 shows a representative divider circuit 100 that includes an input 100A and an output 100B. Divider circuit 100 receives a digital signal exhibiting a predetermined frequency at its input 100A and provides a divided-down version of that digital signal at output 100B. Divider circuit 100 includes latches 105 and 110. The clock input of latch 105 couples to divider input 100A to receive a clock signal, CLK_IN, exhibiting a frequency F. The clock input of latch 105A couples to the clock input of latch 110 such that each latch clock input receives the same CLK_IN signal. The Q output of latch 105 couples to the D input of latch 110. The Q output of latch 110 couples via inverter 115 to the D input of latch 105. The Q output of latch 110 also couples to output 100B of divider circuit 110. In this configuration, divider circuit 100 provides an output signal, CLK_OUT at divider output 100B that exhibits a frequency, F/2, namely one half the frequency of the CLK_IN signal at input 100A. Latches 105 and 110 have a setup and hold requirement, namely a predetermined amount of time that a clock pulse must remain on the clock input of a latch to enable the latch to latch data at the latch's D input. If the CLK_IN signal that divider circuit 100 receives violates the setup and hold requirement, then divider circuit 100 fails. When divider circuit 100 fails, the CLK_OUT signal that divider circuit 100 produces is not equal to a divided down signal, but rather some other waveform.

FIG. 2 shows one embodiment of a system 200 that measures the incremental duty cycle correction, delta ($\Delta$), that a duty cycle correction (DCC) circuit 205 imparts to a clock signal to alter the duty cycle thereof. More particularly, system 200 includes a frequency synthesizer 210 that receives a reference clock signal, REF_CLK, from a reference clock source (not shown). Frequency synthesizer 210 includes a conventional phase lock loop (PLL), voltage controlled oscillator (VCO) and divider circuitry that enables frequency synthesizer 210 to generate an output signal, REF_CLK', at some multiple (M) times the frequency of the REF_CLK signal.

Duty cycle correction (DCC) circuit 205 is a variable duty cycle circuit that receives the REF_CLK' signal from frequency synthesizer 210. In response to the REF_CLK' signal, DCC circuit 205 supplies a CLK_IN signal at its output that is a function of the REF_CLK' signal at its input. DCC circuit 205 may increase or decrease the duty cycle of the REF_CLK' signal to generate the CLK_IN signal. Alternatively, DCC circuit 205 may leave the REF_CLK' signal unaltered and pass the REF_CLK' signal through to the output of DCC circuit 205 as the CLK_IN signal.

FIG. 3A shows a representative 50% duty cycle pulse signal, namely a clock signal REF_CLK' that DCC circuit 205 may receive at its input. This pulse signal includes multiple pulses 300 that correspond to logic highs. A logic low follows each pulse 300 or logic high as shown. The pulse signal exhibits a period, X, namely the time between the beginning of one pulse 300 and the following pulse 300. The pulse signal of FIG. 3A exhibits a logic high for 50% of each pulse period and thus this pulse signal exhibits a 50% duty cycle. When DCC circuit 205 leaves the duty cycle of the REF_CLK signal unaltered, then the CLK_IN signal at the output of DCC circuit 205 also exhibits a 50% duty cycle such as shown in FIG. 3B. If DCC circuit 205 increases the duty cycle of the REF_CLK' signal that it receives, then the pulses 305 of the CLK_IN signal at the output of the DCC circuit exhibit a longer duration than the corresponding pulses 300 at the DCC circuit input. For example, the CLK_IN pulses 305 of FIG. 3C exhibit an expanded duty cycle of 60%. However, if DCC circuit 205 decreases the duty cycle of the REF_CLK' signal that it receives, then the pulses 310 of the CLK_IN signal at the output of the DCC circuit exhibit a shorter duration than the corresponding pulses 300 at the DCC circuit input. In this instance, DCC circuit 205 effectively shrinks the duty cycle of digital pulses it receives. For example, the CLK_IN pulses 310 of FIG. 3D exhibit a reduced duty cycle of 40%.

DCC circuit 205 may thus either expand or shrink the pulse width of pulses 300 that it receives. In one embodiment, the smallest correction to the pulse width that DCC circuit 205 can provide is delta ($\Delta$) picoseconds (pS), namely the incremental duty cycle correction unit. A correction index "i" defines the number of incremental duty cycle correction units $\Delta$ that DCC circuit 205 will apply to a particular digital signal it receives. With a correction index "i", the DCC circuit provides pulse width change or correction equal to i*$\Delta$ picoseconds. The disclosed apparatus and method enables the determination of the incremental correction $\Delta$ for each correction index "i" by using observations with respect to when divider circuit 100 fails as explained in more detail below.

The output of DCC circuit 205 couples to the input of a clock distribution network or clock grid 215. Clock grid 215 distributes the corrected clock signal, namely an altered duty cycle clock signal, CLK_IN, to a number of functional blocks (not shown) that couple to clock grid 215. These functional blocks may include digital logic such as that found in processors, coprocessors, digital logic as well as other electrical circuits. In one embodiment, system 200 also includes the test divider circuit shown above in FIG. 1 as divider circuit 100. Test divider 100 couples to the output of DCC circuit 205 to receive the CLK_IN corrected or altered clock signal therefrom. The output of test divider 100 couples to one input of oscilloscope 220 to deliver a CLK_OUT signal thereto. A remaining input of oscilloscope 220 couples to the input of frequency synthesizer 210. In this manner, oscilloscope 220 receives both the REF_CLK signal and the CLK_OUT signal that test divider 100 generates. In another embodiment, scope 220 receives the REF_CLK' signal from the output of frequency synthesizer 210.

An internal VCO divider in frequency synthesizer 210 exhibits a setting of 2 such that frequency synthesizer 210 generates a 50% duty cycle signal, REF_CLK' it its output.

Thus, the input of DCC correction circuit 205 receives a 50% duty cycle clock signal in this instance. In response, DCC circuit 205 adjusts the pulse waveform of the 50% duty cycle signal by a predetermined amount of time to generate the CLK_IN signal at the output of DCC circuit 205. Test divider circuit 100 receives this CLK_IN signal from DCC circuit 205 and attempts to divide the CLK_IN signal by a predetermined divisor or factor. In this particular example, the divisor is 2 while other divisor values may also be satisfactory depending upon the particular application.

FIG. 4A shows the CLK_IN signal prior to divider action. FIG. 4A also shows the CLK_OUT signal after divider action, namely the divided-down version of the clock signal. In this particular example, divider circuit 100 successfully divided the CLK_IN signal to form the CLK_OUT signal as seen by inspection of the CLK_OUT waveform in FIG. 4A. When divider 100 successfully conducts its division operation, the resultant CLK_OUT waveform is in sync with the CLK_IN signal at the input of the divider and is also in sync with the reference clock signal, REF_CLK. In this case wherein divider 100 is successful, the duration P of pulse 400 is not so long or short as to cause test divider 100 to fail. However, at some frequencies the duration P of pulse 400 becomes so long or short that the pulse waveform violates the setup and hold threshold time, $T_{S/H}$, of divider 100. In response, divider 100 fails to divide.

For example, as seen in FIG. 4B, when the pulses 405 become so long in duration that the time between pulses 405 is equal to or less than $T_{S/H}$, then divider 100 fails. In other words, the resultant output signal of divider 100, namely CLK_OUT, is not a divided down version of CLK_IN, but rather is a corrupt version thereof. The lack of synchronism between the CLK_OUT signal and the REF_CLK signal provides an indicator that divider 100 failed for this particular CLK_IN waveform. In a similar manner, at some frequencies the duration P of pulse 400 becomes so short that it violates the setup and hold threshold time, $T_{S/H}$, of divider 100. In response, divider 100 fails to divide. For example, as seen in FIG. 4C, when the pulses 410 become equal to or less than $T_{S/H}$ in duration, then divider 100 fails. In other words, the resultant output signal of divider 100, namely CLK_OUT, is not a divided down version of CLK_IN, but rather is a corrupt version thereof. Again, the lack of synchronism between the CLK_OUT signal and the REF_CLK signal provides an indicator that divider 100 failed for this particular CLK_IN waveform.

As described above, in one embodiment the RF_CLK' signal that the DCC circuit 205 receives exhibits a 50% duty cycle. X is the period of the REF_CLK' signal that DCC circuit 205 receives. In this case X is also the period of the CLK_IN signal at the output of DCC circuit 205 because the DCC circuit does not alter the period of the signal waveform processed thereby. The smallest correction that DCC circuit 205 may introduce is Δ picoseconds (pS). At correction index "i", the DCC circuit provides a correction equal to i*ΔpS. In one embodiment, correction Δ is one of 10 pS, 20 pS, 30 pS, 40 pS, 50 pS, 60 pS and −10 pS, −20 pS, −30 pS, −40 pS, −50 pS, −60 pS. The designer or user may also select other correction settings depending upon the particular application. For a given correction index setting "i", the pulse width P of the CLK_IN signal at the output of DCC 205 is given by Equation 1 below.

$$P = X/2 + i*\Delta \qquad \text{EQUATION 1}$$

If test divider 100 exhibits a setup/hold time equal to $T_{S/H}$, then when P equals $T_{S/H}$ or when P equals X−$T_{S/H}$, the divider fails. In one embodiment, the disclosed methodology uses the above relationship to experimentally extract the duty cycle correction introduced by DCC circuit 205 for each duty cycle setting. DCC circuit 205 will introduce a different duty cycle correction for each value of i*Δ. For a given DCC setting i, the minimum CLK_IN clock period, $X_{MIN}$, that causes divider 100 to fail is given by replacing P in Equation 1 with $T_{S/H}$. Solving for $X_{MIN}$ yields Equation 2 namely, $$X_{MIN}(i) = [2(T_{S/H} - i\Delta)] \qquad \text{EQUATION 2}$$

Thus for a given correction index "i", the maximum allowed frequency (FMAX) at which divider 100 will operate before failure is given by the Equation 3 below:

$$F_{MAX}(i) = 1/X_{MIN}(i) = 1/[2(T_{S/H} - i*\Delta)] \qquad \text{EQUATION 3}$$

And thus, $$X_{MIN}(i+1) - X_{MIN}(i) = -2i*\Delta \qquad \text{EQUATION 4}$$

This recursive Equation 4 is solvable for all correction indexes "i" to find the correction Δ corresponding to each index i.

A user, designer or other person can observe scope 220 to determine the FMAX frequency for each index setting "i". For a particular index "i", DCC circuit 205 sends a CLK_IN signal exhibiting a duty cycle correction of i*Δ to divider 100 as an input signal. The width of the CLK_IN pulse is thus the original REF_CLK' pulse width plus i*Δ. To observe the divider at frequencies below and at the point of failure, scope 220 receives the divider output signal, CLK_OUT, and triggers off the reference clock signal, REF_CLK. As seen in FIG. 2, scope 220 receives both the divided down CLK_OUT signal and the REF_CLK signal on which the scope triggers. If the divider did not yet fail, and the PLL in frequency synthesizer 210 is currently locked, then the reference clock, REF_CLK, and the divided down CLK_OUT signal from divider 100 are synchronous with one another. When REF_CLK and CLK_OUT are synchronous with one another, a scope user or operator can readily determine this condition by observing a fixed phase relationship between the 2 signals on the scope. However, when divider 100 fails, such as when the CLK_IN signal exceeds $F_{MAX}$ for a particular index i, REF_CLK and CLK_OUT are no longer synchronous with a fixed phase relationship therebetween. Rather, when divider 100 fails, the divider output exhibits a free running characteristic.

Figure 5:
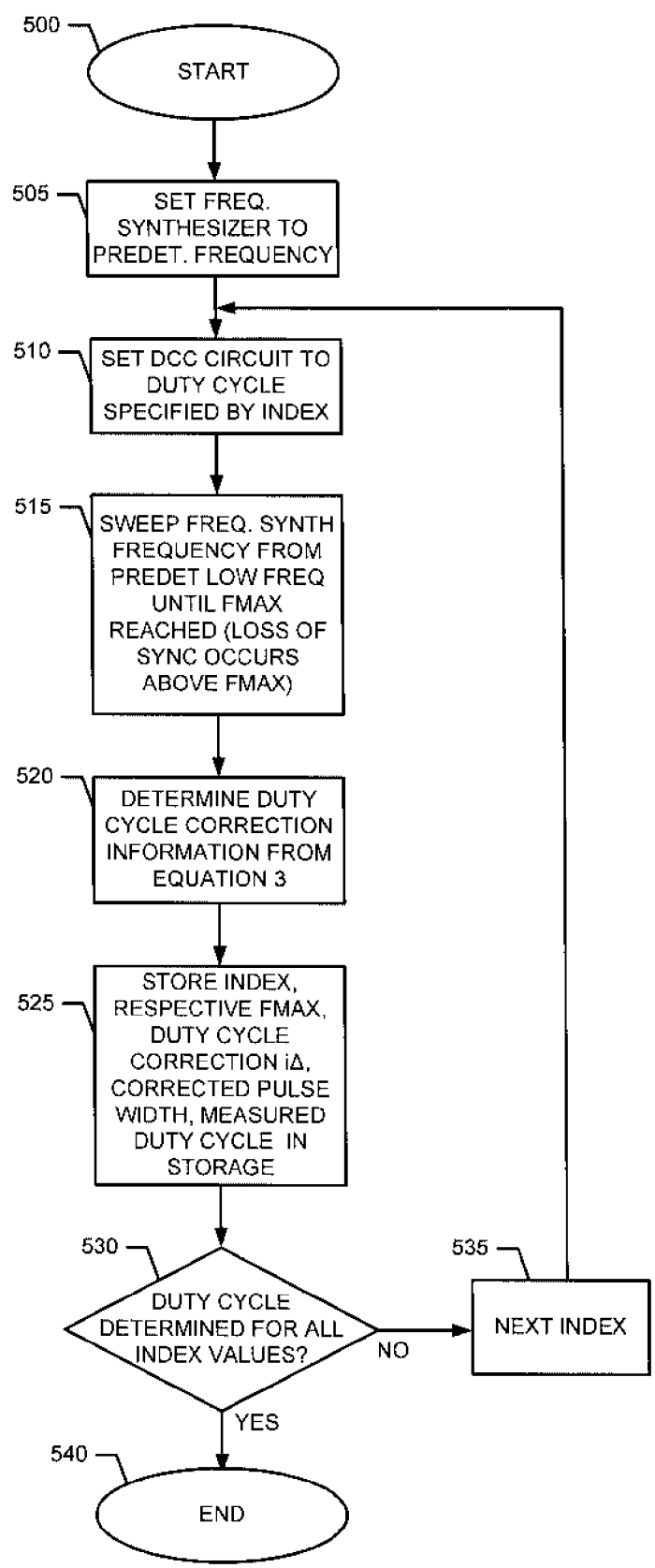
FIG. 5 shows a flowchart that summarizes the operation of one embodiment of the disclosed duty cycle measurement apparatus.

FIG. 5 shows a flowchart that depicts the steps that system 200 employs to characterize or determine the duty cycle of a high speed clock signal such as those that frequency synthesizer 210 and DCC circuit 205 provide. Process flow begins at start block 500. An operator, or alternatively a computer controlled apparatus, sets the frequency of frequency synthesizer 210 to a predetermined initial frequency, as per block 505. The predetermined initial frequency is sufficiently low that it does not result in a pulse width so small that it causes divider 100 to fail. Then, as per block 510, DCC circuit 205 applies a duty cycle correction equal to an initial value that the current correction index specifies. In one embodiment, system 200 may start with a correction index of i=0 that corresponds to zero duty cycle correction by DCC circuit 205, as per block 510. If DCC circuit receives a 50% duty cycle input signal and it applies zero duty cycle correction when index i=0, then the resultant signal at the output of DCC circuit 205 also exhibits a 50% duty cycle. In other words, the pulse width of the CLK_IN signal that divider 100 receives is the same as the pulse width of the REF_CLK' signal at the input of DCC circuit 205. For discussion purposes, assume that the pulse duration of the CLK_IN signal provided by DCC circuit 205 is 100 pS at a 50% duty cycle. The pulse signal period is thus 200 pS of which half of the time the pulse signal exhibits the logic high state and the remaining half of the period the pulse signal exhibits the logic low state. In other words, the pulse itself exhibits a 100 pS duration while the total pulse period is 200 pS.

With the duty cycle thus set according to the initial correction index of i=0, the system operator may manually or with computer assistance sweep the frequency of the REF_CLK' signal that synthesizer 210 generates from a low predetermined value (e.g. 200 MHz) to higher and higher frequencies until the frequency reaches $F_{MAX}$. The operator monitors scope 220 during this sweep to determine at which frequency loss of sync occurs between the CLK_OUT signal and the REF_CLK signal. $F_{MAX}$ is the maximum frequency at which synchronism still exists between CLK_OUT and REF_CLK for a particular duty cycle correction value or index "i". The operator records $F_{MAX}$ manually or via computer assistance along with index "i" and the amount of duty cycle correction. A table or database in storage 225 within computer system 230 provides one convenient way to store each index i and the corresponding $F_{MAX}$ value. The operator may manually or with the assistance of computer system 230 substitute the $F_{MAX}$ value and corresponding "i" value into Equation 3 to determine the Δ, as per block 520. In this particular example wherein the correction index "i" is zero, DCC circuit 205 adds no duty cycle correction iΔ to the pulse that DCC circuit 205 provides to divider 100. In one embodiment, storage 225 stores the index "i", the corresponding $F_{MAX}$, the determined or solved Δ and duty cycle correction iΔ in storage 225, as per block 525. To determine the actual pulse width for a given correction index "i", the operator may manually, or with assistance from computer system 230, add the duty cycle correction iΔ to the pulse width of the REFL_CLK' pulse that DCC circuit 205 receives at its input. To determine the actual duty cycle for a given correction index "i", the operator may manually or with computer assistance divide the corrected pulse width by the period of the pulse signal. Storage 225 may also store this duty cycle value along with the corresponding correction index "i".

Decision block 530 performs a test to determine if system 200 completely tested divider 100 for all values of correction index "i". If other indexes "i" remain that system 200 did not yet test, then system 200 proceeds to the next correction index "i", as per block 535. For example, once system 200 completes testing for index "i"1=0, system 200 increments the index and proceeds to the next positive index "i"=1. DCC circuit 205 sets to the next duty cycle that correction index "i"=1 specifies as per block 510. System 200 performs the frequency sweep again as per block 515 and determines duty cycle correction information as per block 520. System 200 then stores the duty cycle correction information as before, as per block 525. System 200 then tests at decision block 520 and advances to the next positive correction index as per block 535. The process continues until system 200 tests all positive correction indexes "i" and stores the respective duty cycle correction information for each such index. When testing of the positive corrective indexes "i" completes, then system 200 continues testing for all negative values of the corrective index "i". When decision block 530 determines that system 200 completed testing for all corrective indexes "i", then process flow ends as per block 540.

Figure 6:
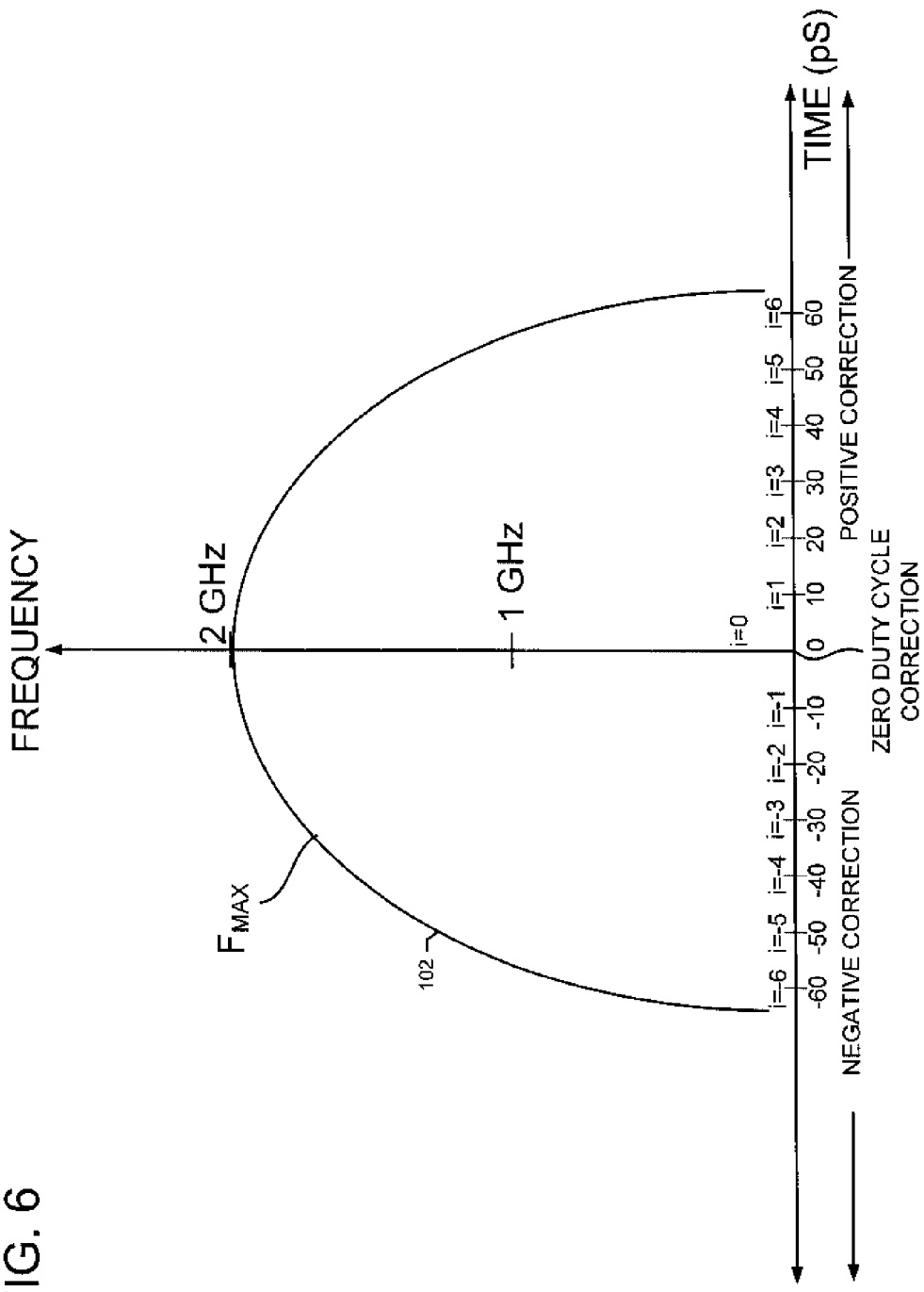
FIG. 6 shows a frequency vs. time graph that depicts a maximum operating frequency without divider failure for multiple duty cycle values.

FIG. 6 is a graph that shows typical $F_{MAX}$ values for each corrective index "i" for which system 200 tests. The x axis shows time in picoseconds (pS) and the y axis shows frequency in gigahertz (GHz). The data depicted in FIG. 6 form an inverted parabolic curve that shows the maximum frequency at which divider 100 successfully operates without failing for each value of the corrective index, i. The maximum value of $F_{MAX}$ occurs at zero duty cycle correction, namely when the clock signal exhibits a 50% duty cycle at correction index i=0.

Figure 7:
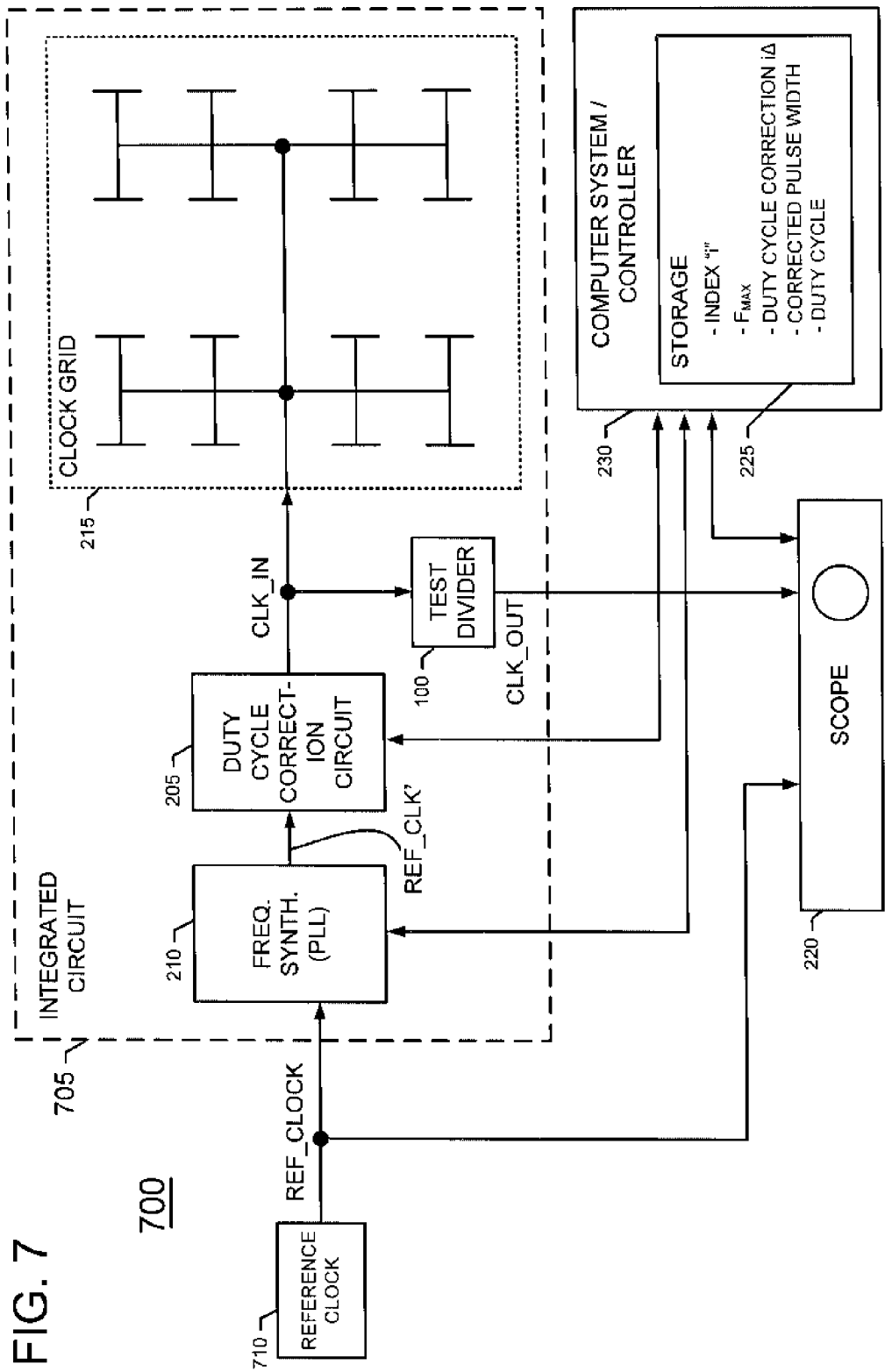
FIG. 7 shows another embodiment of the disclosed duty cycle measurement (DCM) apparatus.

FIG. 7 shows a system 700 similar to system 200 of FIG. 2 with like component numbers indicating like elements. However, system 700 includes an integrated circuit 705 that employs duty cycle correction (DCC) circuit 205, frequency synthesizer 210, clock grid 215 and test divider 100. Integrated circuit 705 may be a processor, multi-processor, co-processor, digital signal processor (DSP) or any other digital logic circuit for which duty cycle measurement is desirable. In system 700, computer system/controller 230 acts as a controller that controls frequency synthesizer 210, DCC circuit 205 and scope 220 to carry out the steps in the FIG. 6 flowchart. More specifically, computer system/controller 230 couples to DCC circuit 205 to provide correction index values "i" to DCC circuit 205 that instruct DCC circuit 205 regarding the particular duty cycle index it should employ at different times during testing, namely a different index for each $F_{MAX}$ frequency sweep. Computer system/controller 230 also couples to frequency synthesizer 210 to sweep the frequency of the REF_CLK' signal from low frequencies to higher frequencies until divider 100 fails, for each correction index value "i", as described above. Computer system/controller 230 also couples to scope 220 to monitor for loss of sync between the REF_CLK and CLK_OUT signal during the respective frequency sweep for each correction index "i". FIG. 7 also shows a reference clock 710 that couples to frequency synthesizer 210 to provide the reference clock signal, REF_CLK, thereto. Computer system 230 includes the computational capability to solve equations 1-4 to determine the actual duty cycle for each correction index value "i", as described above. The system operator may perform these computations manually, or for greater efficiency, computer system/controller 230 may perform these manipulations of the data as equations 1-4 specify. In one embodiment, storage 225 stores each correction index "i" and the corresponding respective $F_{MAX}$, duty cycle correction iΔ, corrected pulse width and duty cycle.

Figure 8:
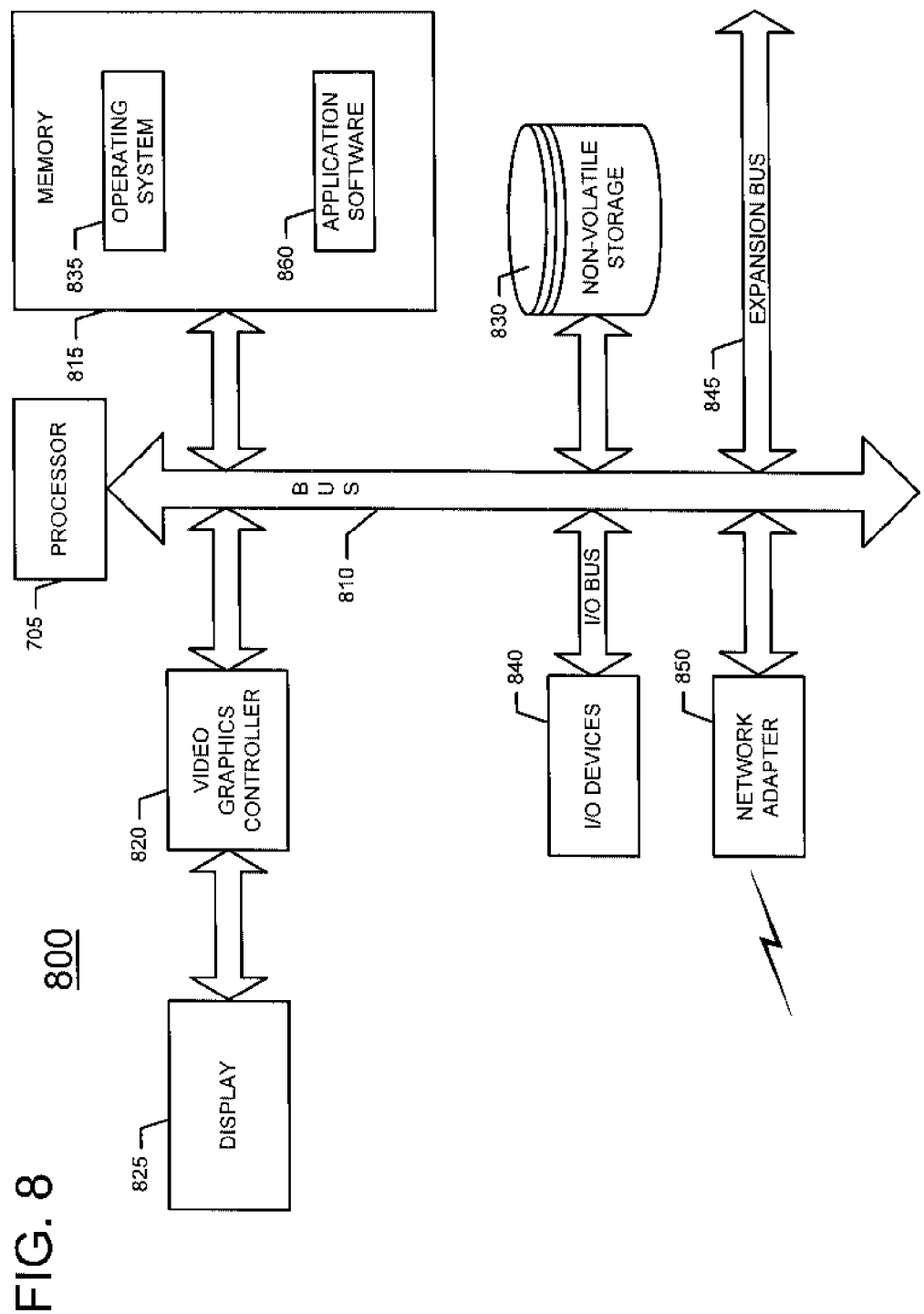
FIG. 8 shows an information handling system (IHS) that employs a processor that uses the disclosed duty cycle measurement apparatus.

FIG. 8 shows an information handling system (IHS) 800 that employs integrated circuit 705 of FIG. 7 as a processor for the IHS. In this example, integrated circuit 705 includes the functional blocks (not shown) typically associated with a processor such an instruction decoder, execution units, load/store units as well as other functional units. Reference clock 710, scope 220 and computer system/controller 230 (not shown in FIG. 8) may couple to integrated circuit processor 705 to perform the duty cycle measurements described above. IHS 800 further includes a bus 810 that couples processor 705 to system memory 815 and video graphics controller 820. A display 825 couples to video graphics controller 820. Nonvolatile storage 830, such as a hard disk drive, CD drive, DVD drive, or other nonvolatile storage couples to bus 810 to provide IHS 800 with permanent storage of information. An operating system 835 loads in memory 815 to govern the operation of IHS 800. I/O devices 840, such as a keyboard and a mouse pointing device, couple to bus 810. One or more expansion busses 845, such as USB, IEEE 1394 bus, ATA, SATA, PCI, PCIE and other busses, couple to bus 810 to facilitate the connection of peripherals and devices to IHS 800. A network adapter 850 couples to bus 810 to enable IHS 800 to connect by wire or wirelessly to a network and other information handling systems. While FIG. 8 shows one IHS that employs processor 705, the IHS may take many forms. For example, IHS 800 may take the form of a desktop, server, portable, laptop, notebook, or other form factor computer or data processing system. IHS 800 may take other form factors such as a gaming device, a personal digital assistant (PDA), a portable telephone device, a communication device or other devices that include a processor and memory. While system 800 of FIG. 8 is an information handling system, computer system/controller 230 of FIG. 7 is itself a form of information handling system.

In many applications that require clock generation and distribution across an electronic circuit such as an integrated circuit chip, it is desirable to know the frequency and duty cycle of the clock signal at various points across the integrated circuit chip. More specifically, it is desirable to know relative duty cycle information of the clock signal at different points of a clock distribution network or clock tree of the integrated circuit chip. For example, such relative duty cycle information is helpful in tracking clock duty cycle degradation as the clock signal propagates across the clock distribution network of the chip. For this and other reasons, there is a need for a methodology and an apparatus that enables the determination or measurement of relative duty cycle information of a clock signal as it propagates across a clock distribution network of an electronic circuit.

Figure 9:
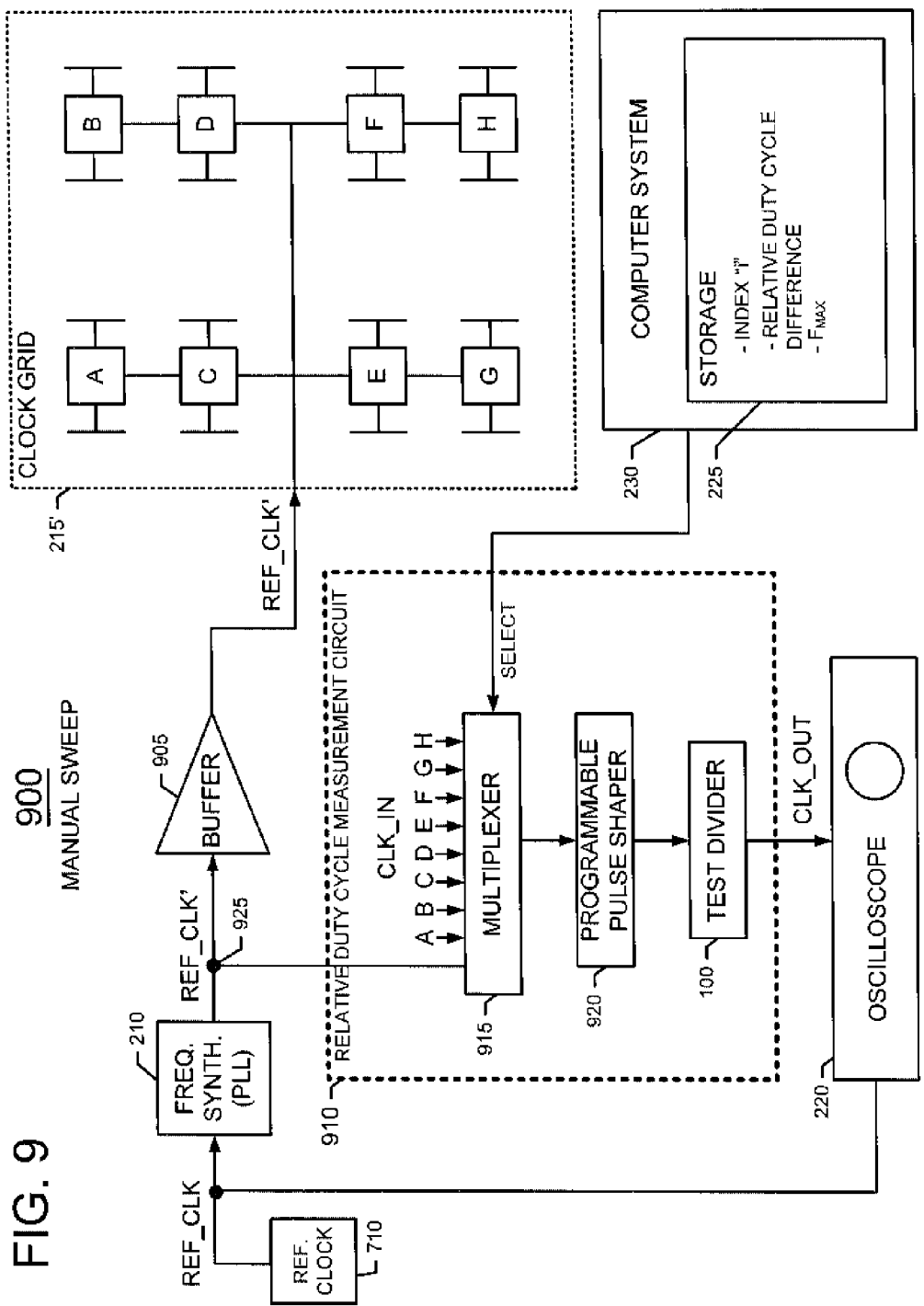
FIG. 9 shows another embodiment of the disclosed duty cycle measurement (DCM) apparatus.

FIG. 9 shows a test system 900 that determines the relative duty cycle of a clock signal as it propagates across a clock distribution network or clock grid 215' of an electronic circuit such as integrated circuit. Test system 900 is thus a relative duty cycle measurement test system. Test system 900 of FIG. 9 includes a number of elements in common with system 200 of FIG. 2 and system 700 of FIG. 7. Like numbers indicate like elements when comparing system 900 of FIG. 9 with system 200 of FIG. 2 and system 700 of FIG. 7. Clock grid 215' of FIG. 9 is similar to clock grid 215 of FIG. 2, except that clock grid 215' identifies a number of different locations or nodes A, B, C, . . . H across the clock grid. As the clock signal travels further and further from its entry point or input to the clock grid, the duty cycle of the clock signal tends to degrade more and more with increasing distance from the input. Clock grid 215' is an electronic circuit that may contain more circuitry than a clock distribution network. One purpose of clock grid 215' is to distribute a clock signal to such other circuitry on an integrated circuit chip.

System 900 includes reference clock 710, frequency synthesizer 210, oscilloscope 220 and computer system or controller 230 in common with system 200 of FIG. 2 or system 700 of FIG. 7. In this particular example, frequency synthesizer 210 receives a reference clock signal, REF_CLK, from reference clock (REF. CLOCK) 710. In response to the REF_CLK signal, frequency synthesizer 210 generates an output signal REF_CLK' at some multiple M of the frequency of the REF_CLK reference clock signal. Frequency synthesizer 210 serves as a clock generation unit for system 900. A buffer 905 couples the output of frequency synthesizer 210 to the input of clock grid 215'. Buffer 905 thus provides a buffered REF_CLK' clock signal to the input of clock grid 215'.

System 900 also includes a relative duty cycle measurement (RDCM) circuit 910 that measures relative duty cycle information at locations or nodes A, B, C, . . . H across clock distribution grid 215'. Relative duty cycle measurement circuit 910 includes a multi-input multiplexer 915. In this particular example, multiplexer 915 includes 9 inputs, namely one input that couples to the output of frequency synthesizer 210 to receive the REF_CLK' reference signal therefrom, and 8 other signal inputs A, B, C . . . H. Each of multiplexer signal inputs A-H couples to a respective one of clock grid 215' locations or nodes A-H by a respective conductor (not shown). For convenience, the letters A-H also designate the clock signals that multiplexer 915 receives from locations or nodes A-H of the clock grid 215'. For example, CLK_IN(A) designates the clock signal that input A of multiplexer 915 receives from clock grid 215' node A, CLK_IN(B) designates the clock signal that input B of multiplexer 915 receives from clock grid 215' node B, and so forth through CLK_IN(H) that designates the clock signal that input H of multiplexer 915 receives from the clock grid 215' node H. The respective duty cycles of clock signals CLK_IN(A)-CLK_IN(H) may be different due to duty cycle degradation of the REF_CLK' signal as it flows through clock grid 215'. Multiplexer 915 may select any one of the clock signals CLK_IN(A)-CLK_IN(H) at its inputs and provide the selected clock signal to the output of multiplexer 915. For example, multiplexer 915 may select the REF_CLK' signal, namely the reference clock signal from frequency synthesizer 210, and send that signal to the multiplexer output. Multiplexer 915 may also select clock signal CLK_IN(A), clock signal CLK_IN(B) or any other clock signal from the clock grid and provide output thereto. Selection of a particular clock signal may be manual by a test system operator or by computer system 230 that couples to a select input (SELECT) of multiplexer 915. In this embodiment REF_CLK' is an external signal in the sense that it is external to clock grid 215'. More particularly, the REF_CLK' signal appears at node 925. In contrast, clock signals CLK_IN(A)-CLK_IN(H) are internal clock signals in the sense that travel from nodes A to H that are internal to clock grid 215'.

The output of multiplexer 915 couples to the input of a programmable pulse shaper 920. Pulse shaper 920 may either expand or shrink the pulse width of the particular clock signal that multiplexer 915 provides thereto. Alternatively, pulse shaper 920 may leave the pulse width of the clock signal unchanged. System 900 uses some of the methodology taught by FIGS. 1-8 and the corresponding description to determine the relative duty cycle difference between a reference clock signal REF_CLK' and the clock signal at each of locations or nodes A-H in clock grid 215'. The output of programmable pulse shaper 920 couples to the input of test divider 100. The output of test divider 100 couples to one signal input of a two signal input oscilloscope 220. The remaining signal input of oscilloscope 220 couples to the output of reference clock 710 to receive the reference clock signal REF_CLK therefrom. In one embodiment, the test methodology employs the property of test divider 100 failure at frequencies that exceed a predetermined value, $F_{MAX}$, or exceed a number of pulse shaper increments as described below.

The smallest positive or negative time increment that pulse shaper circuit 920 can impart to the input signal it receives is delta ($\Delta$) picoseconds (pS), namely the incremental duty cycle change unit. An index "i" defines the number of incremental duty cycle change units $\Delta$ that RDCM circuit 910 will impart to a particular digital signal or clock signal that it receives. Index "i" may exhibit a starting value of 0, then 1, 2, 3 . . . and so forth as it increments. Thus, at index "i", the programmable pulse shaper 920 shrinks or expands the clock signal it receives by an amount equal to i*Δ picoseconds. Frequency synthesizer 210 receives a reference clock signal REF_CLK from reference clock 710. In one embodiment, frequency synthesizer 210 includes a VCO divider set to a divisor value of 2. This action assures a 50% duty cycle at the output of frequency synthesizer 210. Thus, the REF_CLK' signal at node 925 exhibits a 50% duty cycle. As in the case of the other embodiments above, X defines the period of the clock signal at node 925 or the output of frequency synthesizer 210. For discussion purposes, assume that multiplexer 915 selects the clock signal at node 925, namely the REF_CLK' signal. In this scenario, RDCM circuit 910 operates in a "benchmark mode" and multiplexer 915 supplies the REF_CLK' signal to programmable pulse shaper 920. For a given index setting "i", the pulse width P of the resultant clock signal at the output of pulse shaper 920 is given as before by Equation 1.

$$P = X/2 + i*\Delta \qquad \text{EQUATION 1}$$

If test divider 100 exhibits a setup/hold time of time, $T_{S/H}$, then when the pulse width $P=T_{S/H}$, or $P=X-T_{S/H}$, the test divider 100 fails. A test operator may view oscilloscope 220 to observe this failure of test divider 100. More particularly, with the phase lock loop (PLL) of frequency synthesizer 210 locked, the REF_CLK reference clock signal feeds one input of oscilloscope 220. The output signal of test divider 100 feeds the remaining input of oscilloscope 222 and thus provides the CLK_OUT signal thereto. When the PLL frequency synthesizer 210 exhibits a lock and test divider 100 does not yet exhibit failure, then a synchronous relationship exists between the REF_CLK signal at one input of oscilloscope 220 and the CLK_OUT signal at the remaining input of oscilloscope 220. A test operator may readily determine the existence of this synchronism by observing oscilloscope 220.

For a given clock period X at node 925, as the index "i" increases, the test system 900 reaches a point where $P>=X-T_{S/H}$, or $P<=T_{S/H}$, and then test divider 100 fails. A test operator who observes oscilloscope 220 can readily see the loss of synchronism between REF_CLK and CLK_OUT. Under these conditions, the output of relative duty cycle measurement circuit 910 no longer provides a synchronous signal to scope 220.

Test system 900 operates in two modes to determine the relative duty cycle of a clock signal as it travels across a number of different locations or nodes A, B, . . . H in clock distribution grid 215'. In more detail, test system 900 operates first in a "benchmark mode" and then later in a "relative mode". Test system 900 first determines information with respect to the duty cycle of the reference clock signal, REF_CLK', in the benchmark mode. Test system 900 then switches or changes modes to the relative mode. In the relative mode, test system 900 determines the relative duty cycle of one of the clock grid signals, CLK_IN (A), CLK_IN (B), . . . CLK_IN(H), in comparison with the duty cycle of the REF_CLK' signal that the benchmark signal mode employs.

In benchmark mode multiplexer 915 selects the signal at node 925, namely the REF_CLK' signal, as the reference signal. Multiplexer 925 thus passes the REF_CLK' signal through to the multiplexer output. The multiplexer output then feeds the selected REF_CLK' signal to test divider 100 via pulse shaper 920. The smallest increment by which programmable pulse shaper 920 may alter the signal it receives is delta (Δ) picoseconds (pS), namely the incremental duty cycle change unit. For this test, assume that when multiplexer 915 selects the REF_CLK' signal at node 925, the test divider 100 fails at some index value "i"=n of pulse shaper 920. In one embodiment, with frequency synthesizer 210 operating at a fixed frequency for REF_CLK1, pulse shaper 920 sweeps through index values i until test divider 100 fails at a particular index value i=n. In other words, pulse shaper 920 starts with an index i=0, then advances to i=1, then advances to i=2 and so forth until test divider 100 failure occurs at a particular index value i=n. Cycling the index i in the negative direction i=0, i=−1, i=−2, and so forth is also possible to locate a negative index value at which test divider 100 fails.

Test system 900 switches to relative mode after completion of benchmark mode above. In relative mode, multiplexer 915 selects any one of the other clock input signals CLK_IN(A) . . . CLK_IN(H) from clock distribution grid nodes A-H for a comparison to the benchmark signal results. For example, multiplexer 915 may select the clock signal at input A of multiplexer 915, namely the CLK_IN(A) clock signal. In this case, multiplexer 915 supplies the CLK_IN (A) signal to programmable pulse shaper 920. Pulse shaper 920 steps through its increments from i=0, to i+1, to i+2, to i+3 . . . to i+N and i to i−1 to i−2 to i−3 to i−N, wherein N is the maximum number of positive or negative increments. In this particular example, the test operator who views oscilloscope 220 obverses that the test divider 100 fails at index i+3. Thus, the relative duty cycle distortion between node 925 (the REF_CLK' signal) and clock grid 215' location or node A (the CLK_IN(A) signal) is "3×Δ" picoseconds.

In this largely manual process for determining the relative duty cycle difference or distortion between two points in an electronic circuit, the process may receive some assistance from computer system 230. For example, the coupling of computer system 230 to the select input (SELECT) of multiplexer 915 enables computer system 230 to select any one of the inputs of multiplexer 915. Computer system 230 includes storage 225 that is conveniently usable to store data that the test operator collects from test system 900. For example, storage 225 may store index values "i", increment information, point of divider failure information, and relative duty cycle difference information such as the "3×Δ" picoseconds result in the above example.

Figure 10:
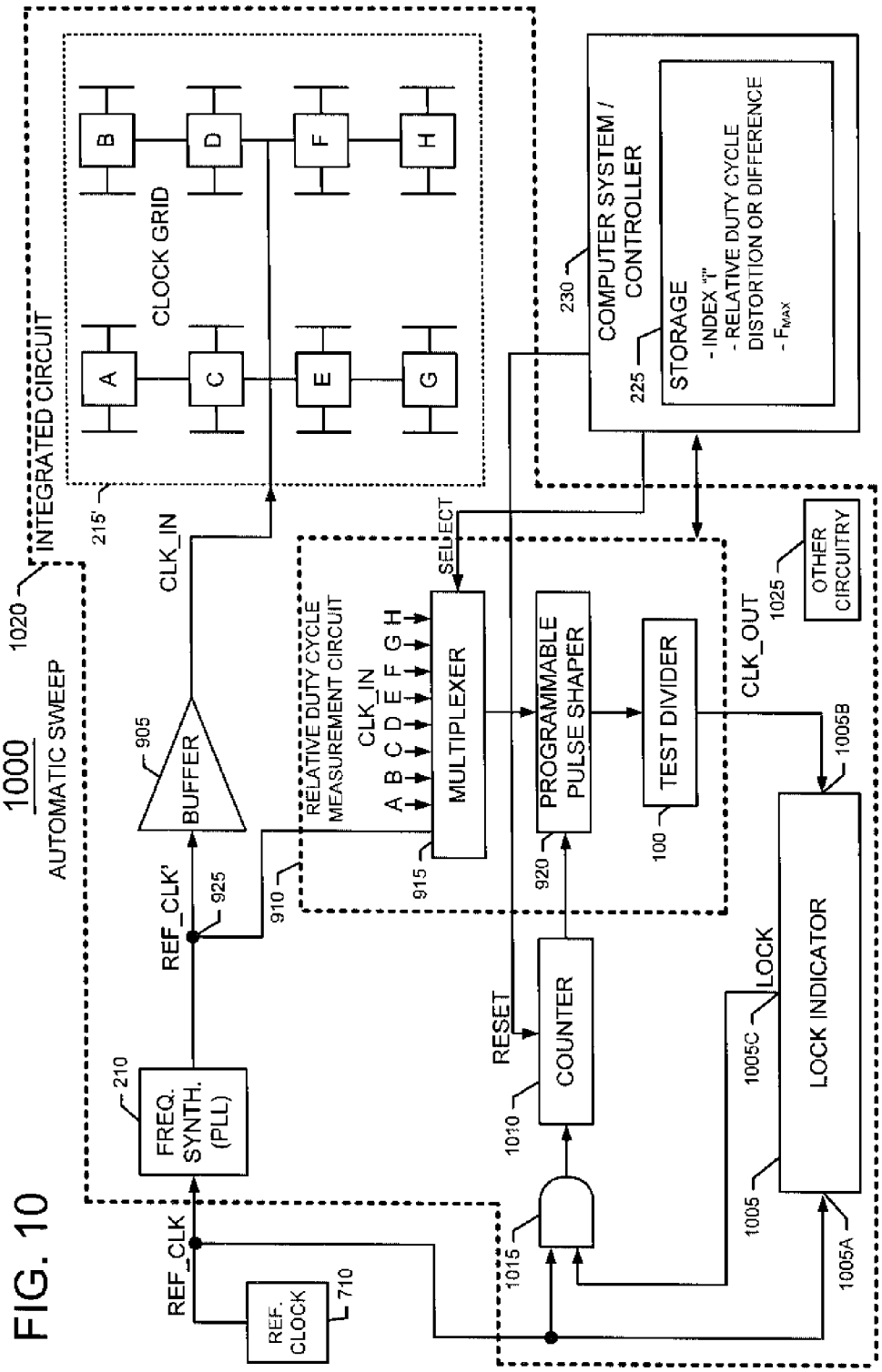
FIG. 10 shows yet another embodiment of the disclosed duty cycle measurement (DCM) apparatus.

While the largely manual process described above is useful to determine the relative duty cycle difference between two points or locations on an integrated circuit, automating the process is desirable. In the manual process to which FIG. 9 refers, the test operator manually sweeps through all the pulse shaper settings of index "i" until test divider 100 fails. FIG. 10 shows a test circuit 1000 that performs relative duty cycle determination between two points of an electronic circuit in a more automated fashion. The automatic test circuit 1000 of FIG. 10 includes many components in common with test circuit 900 FIG. 9. In comparing FIG. 10 with FIG. 9, like numerals indicate like elements.

Instead of the oscilloscope 220 that test system 900 employs, test system 1000 employs a lock indicator 1005 to determine if the CLK_OUT output signal exhibits synchronism with respect to the REF_CLK reference clock signal. Lock indicator 1005 includes signal inputs 1005A and 1005B. Lock indicator signal input 1005A couples to the output of reference clock 710 to receive the reference clock signal REF_CLK therefrom. Lock indicator signal input 1000B couples to the output of test divider 100 to receive the CLK_OUT clock signal therefrom. Lock indicator circuit 1005 generates a LOCK signal at output 1005C to indicate if the signals at inputs 1005A and 1005B exhibit synchronism with respect to one another. If the two input signals exhibit synchronism, then the LOCK signal exhibits a logic high. However, if the two input signals do not exhibit synchronism, then the LOCK signal exhibits a logical low. In an alternative embodiment, signal input 1005A couples to node 925 to receive the REF_CLK' signal therefrom. In this case when operating in relative mode, lock indicator indicates synchronism between one of clock input signals CLK_IN(A) . . . CLK_IN(B) and the REF_CLK' signal.

The RDCM circuit 910 of test 1000 includes a counter 1010, the output of which couples to programmable pulse shaper 920, as shown. RDCM circuit 910 also includes an AND gate 1015, the output of which couples to the input of counter 1010. Lock indicator output 1005C couples to one input of AND gate 1015. In this manner, AND gate 1015 receives the LOCK signal at one input. The remaining input of AND gate 1015 couples to reference clock 710. In this manner, AND gate 1015 receives the REF_CLK reference clock signal at the remaining input. The output of the counter selects a particular pulse shaper circuit 920 setting, i.e. the number of increments "i" by which pulse shaper circuit 920 will expand or contract, respectively, the duty cycle or pulse width of the clock signal that flows through pulse shaper circuit 920.

In one embodiment, at or near the beginning of each benchmark mode test, computer system 230 sends a RESET signal to the RESET input of counter 1010 to initialize the counter to its default value. For example, the default value of counter 1010 may be 0 in one embodiment. Before the test starts, the phase lock loop (PLL) in frequency synthesizer 210 exhibits a lock. The test commences in "benchmark mode" with computer system 230 sending a SELECT signal that instructs multiplexer 915 to transmit the REF_CLK' signal from node 925 to programmable pulse shaper 920. Under these conditions, the CLK_OUT signal of test divider 100 is in synchronism with respect to the REF_CLK signal. Consequently, the LOCK signal at lock indicator output 1005C exhibits a logic high. Computer system 230 resets counter 1010 to its default value via the RESET signal. The LOCK signal at the output 1005C of lock indicator 1005 exhibits a logic high and thus the output of AND gate 1015 goes high on the next REF_CLK signal edge. Thus, counter 1010 counts to its next count value. In response, pulse shaper circuit 920 increments or advances to the next value of index "i". In other words, each time the output of counter 1010 counts by one, programmable pulse shaper circuit 920 moves to the next increment index value and accordingly adjusts the duty cycle or pulse duration of the selected clock signal that passes therethrough. If the LOCK signal remains high, then counter 1010 increments its output count value on the next edge of the REF_CLK reference clock signal that AND gate 1015 receives. In response to counter 1010 incrementing the output count value, pulse shaper circuit 920 increments to its next increment index. For example, if the index "i" that pulse shaper 920 first employs is "i=0", then the next index that pulse shaper circuit 920 employs when the counter increments is "i=1". An index of i=0 corresponds to no adjustment in the duty cycle of the clock signal passing through pulse shaper 920. An index of i=1 corresponds to an adjustment of 1×delta (Δ) picoseconds to the duty cycle or pulse duration of the signal passing through pulse shaper 920. An index of i=2 corresponds to an adjustment of 2×delta (Δ) picoseconds to the duty cycle or pulse duration of the signal passing through pulse shaper 920. This process of counter 1010 counting, and pulse shaper 920 incrementing or advancing through the indexes i, continues until lock indicator 1005 transitions the LOCK signal from high to low to indicate test divider failure and loss of synchronism between the CLK_OUT and REF_CLK signals. In response to the LOCK signal transitioning from high to low, counter 1010 stops counting. The count value in counter 1010 at the time the counter stops counting and the corresponding increment index "i" value become the benchmark against which system 100 compares subsequent measurements. Computer system 230 may store this count value and index "i" in storage 225 as corresponding to the benchmark test of "benchmark mode". Benchmark mode now ends.

Test system 100 now switches to "relative mode" wherein multiplexer 915 selects another input signal from clock distribution grid 215', for example the CLK_IN (A) signal from node A of the clock grid. The above process of counter 1010 counting and pulse shaper 920 incrementing through the index "i" values begins anew and continues until lock indicator signal LOCK goes low to indicate divider failure and loss of synchronism between the CLK_IN(A) clock signal and the REF_CLK reference clock signal. At this time, counter 1010 again stops counting. Computer system 230 may store the count value associated with the CLK_IN (A) signal in storage 225 along with the associated current increment index value for "i" of pulse shaper 920.

The difference in the count value associated with the CLK_IN(A) clock signal of "relative mode" and the count value associated with the REF_CLK' clock signal of "benchmark mode" provides an indication of the relative duty cycle distortion between the signal at node 925 and node A of clock grid 215'. For example, assume that the final count value equals 10 for the "benchmark mode" that earlier tested the REF_CLK' signal of node 925. Also assume that the final count value equals 13 for the "relative mode" that tests the CLK_IN(A) clock signal from node A of clock grid 215'. In this scenario, there is a relative duty cycle distortion equal to Δ times the difference between 13 and 10, namely Δ times 3, or 3 Δ, wherein Δ represents the granularity of pulse shaper circuit 920.

The granularity Δ of pulse shaper circuit 920 limits the margin of error of this measurement process. The accuracy of the relative duty cycle distortion reading of test circuit 1000 increases as the granularity Δ of pulse shaper circuit 920 becomes smaller. In one embodiment, the granularity Δ of pulse shaper circuit 920 should be approximately 5 picoseconds or less for acceptable measurement accuracy. The granularity Δ of pulse shaper circuit 920 may also exceed approximately 5 picoseconds, depending on the particular application. The value of a granularity Δ is determinable using the apparatus and methodology taught by FIGS. 1-7 and the corresponding description above.

Figure 11:
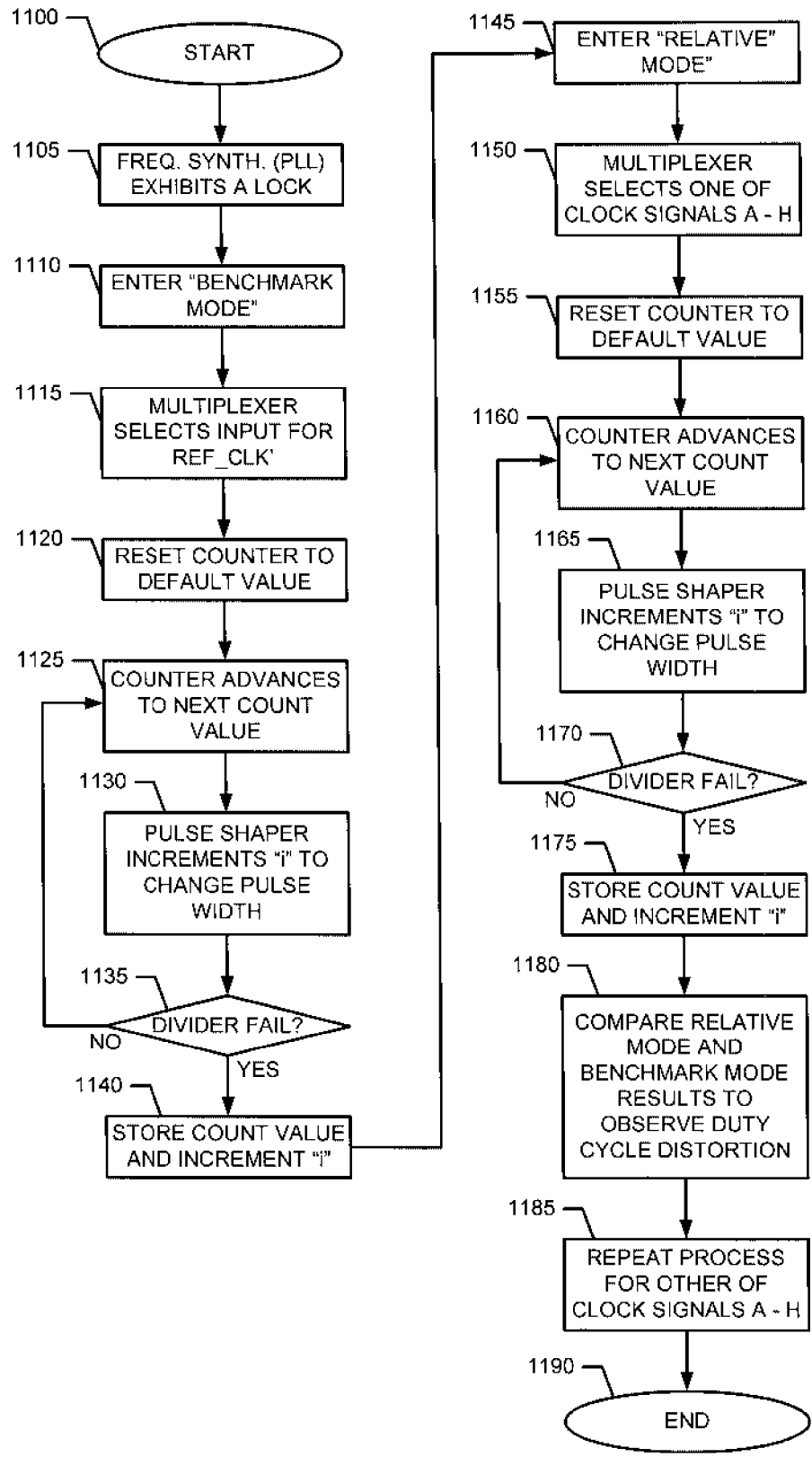
FIG. 11 shows a flowchart that summarizes the operation of one embodiment of the disclosed relative duty cycle measurement apparatus.

FIG. 11 is a flowchart that summarizes the method steps that test circuit 1000 employs to determine the relative duty cycle difference of a clock signal as it flows from one location to another on an electronic circuit. Process flow commences at start block 1100. The phase lock loop (PLL) of frequency synthesizer 210 exhibits a lock, as per block 1105. With frequency synthesizer 210 thus locked, test system 1000 enters "benchmark mode", as per block 1110. In benchmark mode, multiplexer 915 selects the REF_CLK' signal as its input signal and transmits the REF_CLK' signal to the multiplexer output, as per block 1115. Computer system 230 acts as a controller that resets counter 1010 to its default start value, as per block 1120. With the LOCK signal of lock indicator 1005 indicating synchronism between the REF_CLK signal at input 1005A and the CLK_OUT signal that corresponds to no pulse shaping of the REF_CLK' signal, counter 1010 advances to the next count value. Pulse shaper circuit 920 increments "i" to change the pulse width of the clock signal passing therethrough according to the current value of increment index "i". Lock indicator 1005 tests the resultant CLK_OUT signal for a lack of synchronism with respect to the REF_CLK signal, as per decision block 1135. Such a lack of synchronism indicates that test divider 100 failed. If decision block 1135 determines that test divider 100 did not fail, then process flow continues back to block 1125 at which counter 1010 advances to the next count value. The process continues with pulse shaper circuit 920 incrementing "i" and counter 1010 advancing the count until decision block 1135 determines that divider 100 failed. In the event of such divider failure, process flow continues to block 1140 at which computer system 230 stores the current count value of counter 1010 and the corresponding current increment index "i" in storage 225. Test circuit 1000 thus establishes a relative duty cycle benchmark in "benchmark mode" for comparison later with a duty cycle indication of another clock signal in "relative mode".

After establishing a benchmark in this manner, test system 1000 switches from "benchmark mode" to "relative mode" to determine the relative duty cycle of one of the clock grid signals CLK_IN (A) . . . CLK_IN(H) with respect to the REF_CLK' clock signal at node 925. This switch to "relative mode" occurs in block 1145. Computer system 230 acts as a controller that instructs multiplexer 915 to select one of the signals at inputs A-H thereof, as per block 1150. For example, multiplexer 915 may select the CLK_IN(A) signal at input A of the multiplexer. Computer system 230 acts as a controller that instructs counter 1010 to reset to its default value, as per block 1155. Counter 1010 and advances to the next count value as per block 1160, in a manner similar to that of block 1125. In response to the next count value, pulse shaper circuit 920 increments index "i" to change the pulse width and duty cycle of the CLK_IN(A) signal passing therethrough, as per block 1165. Lock indicator 1005 then conducts a test to determine if test divider 100 exhibits failure, as per decision block 1170. If lock indicator 1005 indicates no failure, then process flow continues back to block 1160 where counter 1010 advances the count value. In response, pulse shaper circuit 920 again increments index "i" to change the pulse width and duty cycle. Decision block 1170 again conducts the divider failure test. The process continues until decision block 1170 determines that test divider 100 failed. In that event, computer system 230 stores the current count value and corresponding increment index "i" for the selected CLK_IN(A) clock signal in storage 225, as per block 1175. By way of example, if the index of programmable pulse shaper 920 begins with index "i=0" and advances to "i+3", then the relative duty cycle distortion between node 925 and node A of clock distribution grid 215' is "3 Δ", wherein Δ represents the granularity of pulse shaper circuit 920. In other words, as per block 1185, a test system operator or computer system 230 compares the relative mode results with the benchmark mode results to observe relative duty cycle distortion information as the clock signal propagates across clock grid 215' to a selected node of clock grid 215'. Computer system 230 may also store the relative duty cycle distortion value in storage 225 together with the corresponding index information. In one embodiment, the above process repeats multiple times until the test system determines relative duty cycle distortion information for all of the distribution nodes A-H of clock grid 215' relative to the REF_CLK external clock signal, as per block 1185. When computer system 230 collects duty cycle information for all distribution nodes A-H, the process ends, as per block 230.

In one embodiment, many elements of test system 100 couple together on a common semiconductor chip or integrated circuit 1020. Integrated circuit 1020 includes frequency synthesizer 210, buffer 905, clock distribution grid 215', relative duty cycle measurement (RDCM) circuit 910, lock indicator 1005, counter 1010 and AND gate 1015. In one embodiment, the circuitry of integrated circuit 1020 of FIG. 10 substitutes for the circuitry of processor 705 of IHS 800 of FIG. 8. In such an embodiment, the processor includes both the circuitry of integrated circuit 1020 and processor circuitry such as an instruction fetcher, instruction decoder, execution units, register file as well as other processor circuitry. Alternatively, integrated circuit 1020 of FIG. 10 may include other circuitry 1025 that includes processor circuitry such as an instruction fetcher, instruction decoder, execution units, register file as well as other processor circuitry.

The foregoing discloses a methodology and apparatus that determines the relative duty cycle distortion of a clock signal as it flows from an input to a number of different locations or nodes in a clock distribution grid of an electrical circuit such as an integrated circuit.

Modifications and alternative embodiments of this invention will be apparent to those skilled in the art in view of this description of the invention. Accordingly, this description teaches those skilled in the art the manner of carrying out the invention and is intended to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

What is claimed is:

1. A method of determining duty cycle information for an electronic circuit, the method comprising:
   sending, by a clock signal generator, a clock signal to the electronic circuit, the electronic circuit including a clock distribution network that distributes the clock signal to a plurality of locations across the clock distribution network;
   operating, by a relative duty cycle measurement circuit, in a benchmark mode to determine benchmark duty cycle information with respect to the clock signal at a location external to the clock distribution network, thus designating an external clock signal;
   operating, by the relative duty cycle measurement circuit, in a relative mode to determine relative duty cycle information of the clock signal at one of the plurality of locations in the clock distribution network relative to the benchmark duty cycle information, thus designating an internal clock signal;
   selecting as an input signal, by a multiplexer, the external clock signal when the relative duty cycle measurement circuit operates in the benchmark mode;
   selecting as an input signal, by the multiplexer, the internal clock signal when the relative duty cycle measurement circuit operates in the relative mode; and supplying, by the multiplexer while in the benchmark mode, the external clock signal to a programmable pulse shaper circuit that alters the duty cycle of the external clock signal by a number of increments and that supplies a modified external clock signal to a test divider, the number of increments being increased until the test divider exhibits failure, the test divider providing a test divider output signal.

2. The method of claim 1, further comprising supplying, by the multiplexer while in the relative mode, the internal clock signal to the programmable pulse shaper circuit that alters the duty cycle of the internal clock signal by a number of increments and that supplies a modified internal clock signal to a test divider, the number of increments being increased until the test divider exhibits failure, the test divider providing a test divider output signal.

3. The method of claim 2, further comprising comparing the number of increments at which the test divider exhibits failure in the benchmark mode to the number of increments at which the test divider exhibits failure in the relative mode to provide an indication of duty cycle distortion between the external clock signal and the internal clock signal.

4. The method of claim 1, further comprising testing, by a lock indicator circuit, for synchronism between the test divider output signal and the external clock signal, a lack of synchronism indicating failure of the test divider.

5. The method of claim 1, further comprising providing, by an oscilloscope, an indication of synchronism between the test divider output signal and the external clock signal, a lack of synchronism indicating failure of the test divider.

6. A test system comprising:
an electronic circuit including a clock grid that distributes a clock signal to a plurality of distribution nodes that the clock grid includes;
a clock signal generator, coupled to the electronic circuit, that generates the clock signal for distribution by the clock grid;
a relative duty cycle measurement circuit, coupled to the clock signal generator and the plurality of distribution nodes of the clock grid, the relative duty cycle measurement circuit operating in a benchmark mode to determine benchmark duty cycle information with respect to the clock signal at a location in the test system external to the clock grid, thus designating an external clock signal, and further operating in a relative mode to determine relative duty cycle information of the clock signal at one of the plurality of distribution nodes in the clock grid relative to the benchmark duty cycle information, thus designating an internal clock signal wherein the clock signal generator comprises a frequency synthesizer;

wherein the relative duty cycle measurement circuit including a multiplexer that selects the external clock signal as a multiplexer input signal when the relative duty cycle measurement circuit operates in the benchmark mode;

wherein the multiplexer selects as an input signal the internal clock signal from one of the plurality of distribution nodes in the clock grid when the relative duty cycle measurement circuit operates in the relative mode; and wherein the relative duty cycle measurement circuit includes a programmable pulse shaper circuit that operates in the benchmark mode to alter the duty cycle of the external clock signal by a number of increments and that supplies a resultant modified external clock signal to a test divider that couples to the relative duty cycle measurement circuit, the number of increments being increased by the programmable pulse shaper circuit until the test divider exhibits failure.

7. The test system of claim 6, wherein the programmable pulse shaper circuit operates in the relative mode to alter the duty cycle of the internal clock signal by a number of increments and that supplies a resultant modified internal clock signal to the test divider, the number of increments being increased until the test divider exhibits failure.

8. The test system of claim 7, further comprising a controller coupled to the relative duty cycle measurement circuit, the controller comparing the number of increments at which the test divider exhibits failure in the benchmark mode to the number of increments at which the test divider exhibits failure in the relative mode to provide an indication of duty cycle distortion between the external clock signal and the internal clock signal.

9. The test system of claim 7, wherein the electronic circuit comprises an integrated circuit.

* * * * *